US010468231B1

(12) United States Patent
Arnold et al.

(10) Patent No.: US 10,468,231 B1
(45) Date of Patent: Nov. 5, 2019

(54) METHODS OF OPERATING PARTICLE MICROSCOPES AND PARTICLE MICROSCOPES

(71) Applicant: Carl Zeiss Microscopy GmbH, Jena (DE)

(72) Inventors: Rainer Arnold, Thalfingen (DE); Marcin Janaszewski, Pabianice (PL)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/007,236

(22) Filed: Jun. 13, 2018

(51) Int. Cl.
| H01J 37/28  | (2006.01) |
| H01J 37/147 | (2006.01) |
| H01J 37/21  | (2006.01) |
| H01J 37/20  | (2006.01) |

(52) U.S. Cl.
CPC .......... *H01J 37/28* (2013.01); *H01J 37/147* (2013.01); *H01J 37/21* (2013.01); *H01J 37/20* (2013.01)

(58) Field of Classification Search
CPC .......... H01J 37/28; H01J 37/147; H01J 37/21; H01J 37/20
USPC .......................... 250/306, 307, 309, 310, 311
See application file for complete search history.

(56) References Cited

U.S. PATENT DOCUMENTS

| 2003/0147332 A1* | 8/2003  | Ichimura ............. G11B 7/08511 369/112.24 |
| 2006/0278826 A1* | 12/2006 | Roberts ................. H01J 37/222 250/310 |
| 2015/0155138 A1* | 6/2015  | Yoshikawa ......... H01J 37/3177 250/492.22 |
| 2016/0225578 A1  | 8/2016  | Preikszas |

OTHER PUBLICATIONS

Van Bree, P.J., "Control of Dynamics and Hysteresis in Electromagnetic Lenses," Technische Universiteit Eindhoven, 2011, pp. 1-148.

* cited by examiner

*Primary Examiner* — Nicole M Ippolito
(74) *Attorney, Agent, or Firm* — Fish & Richardson P.C.

(57) ABSTRACT

A particle microscope includes a particle beam system directing a particle beam onto a sample. The particle beam system includes a magnetic lens energized by an adjustable lens current. The sample is positioned at an adjustable distance from the lens, and particles of the beam have an adjustable kinetic energy. A method of operating such microscope includes positioning a sample at a distance from the lens, adjusting the kinetic energy, changing the lens current at plural different lens current change rates, determining a lens current at focus for each of the plural different lens current change rates, and determining an optimized lens current based on the determined lens currents at focus and the lens current change rates.

31 Claims, 6 Drawing Sheets

METHODS OF OPERATING PARTICLE MICROSCOPES AND PARTICLE MICROSCOPES

FIELD

The present disclosure relates to methods of operating particle microscopes and to particle microscopes configured to perform such methods. The disclosure in particular relates to methods of adjusting a focus of the particle microscope having a magnetic lens such that sharp images having a high contrast can be recorded.

BACKGROUND

In general, in a conventional method of operating a particle microscope, a sample is positioned at a given distance from a magnetic objective lens of the microscope and a voltage between a particle source and the sample is set to a given value. This voltage is involved in determining the kinetic energy of the particles impinging on the object. Thereafter, generally, a lens current supplied to the objective lens has to be adjusted such that the particle beam is focused at the sample surface. Typically, the value of this lens current achieving the focus is initially not known because the precise distance of the sample from the objective lens is typically not known. A procedure of determining a lens current optimized for achieving the focus of the particle beam at the sample is usually performed.

For example, the lens current can be adjusted to different values, and, at each of the different lens current values, image information of the sample is obtained using the particle beam system. The image information is analyzed to determine a contrast, and next lens current values are determined based on the determined contrast and previous settings of the lens current in an iterative search process until a satisfactory optimized lens current is found.

It is to be noted that, generally, the magnetic objective lens has a high inductance such that it is not possible to rapidly change the lens current to a desired value. Therefore, the above process is, in general, time consuming.

According to another procedure, the lens current is continuously changed from a low value to a high value or from a high value to a low value, wherein the high and low values are selected such that the expected optimized lens current is in between these values. Image information is continuously recorded during such scan of the lens current between the low and high values. If the sample is sufficiently structured, the image information will show a peak contrast at a time during the scan where the beam is focused at the object. The lens current supplied to the objective lens at that time could be used as the optimized lens current. However, if the lens current is set to this optimized lens current and images of the sample are recorded at this optimized lens current, generally, it appears that a nearly optimal focus adjustment has not been achieved and that the focus can be further improved.

SUMMARY

The present disclosure seeks to provide a method of operating a particle microscope in which an optimized lens current allowing reasonable focusing can be achieved in a relatively short time.

According to embodiments of the disclosure, a particle microscope includes a particle beam system configured to direct a particle beam onto a sample to be inspected, wherein the particle beam system includes a magnetic lens energized by an adjustable lens current for focusing the particle beam on the sample, wherein the sample is positioned at an adjustable distance from the magnetic lens and wherein particles of the particle beam have an adjustable kinetic energy when impinging on the sample.

For example, the kinetic energy of the particles impinging on the sample can be adjusted by changing a high voltage between a particle beam source and the sample. For example, the sample can be mounted in front of the objective lens on a sample holder or stage which is configured to displace the sample relative to the objective lens such that a distance between the sample and the lens can be changed. The sample holder or stage can be connected to ground such that a high voltage supplied to a particle source of the particle beam system alone can be changed for changing the kinetic energy of the particles incident on the sample. According to other examples, the electric potential of the sample holder or stage can be set to adjustable voltages different from ground.

The lens current supplied to a coil of the magnetic lens generates a magnetic field. The magnetic lens further includes pole pieces partially surrounding the coil and providing a gap, wherein a strong magnetic field can be generated in this gap and will then have a focusing effect on the particle beam traversing the magnetic lens. The magnetic lens may include an objective lens of the particle beam system and other lenses, such as a condenser lens, of the particle beam system.

According to some embodiments, a method of operating a particle microscope includes positioning a sample at a given distance from a magnetic lens of the particle microscope, adjusting a kinetic energy of particles of a particle beam generated by the particle microscope and incident on the sample to a given kinetic energy, changing a lens current supplied to a magnetic lens traversed by the particle beam at plural different lens current change rates, determining a lens current at focus for each of the plural different lens current change rates, determining an optimized lens current based on the determined lens current at focus and the lens current change rates, and setting the lens current to the optimized lens current and inspecting the sample using the set lens current.

The lens current at focus is that lens current supplied to the magnetic lens during a change of the lens current where the particle beam is focused on the sample as far as it can be determined using the particle microscope. For example, the particle beam system can be operated to continuously scan the particle beam across the sample surface and detect signals produced by the particles incident on the sample. These signals can be backscattered electrons or secondary electrons detected by a suitable detector, for example. The particle beam can be scanned across the sample surface along straight lines, for example. When the sample has a structure detectable by the particle microscope, the intensity of the signals generated by the incident particle beam will fluctuate during a scan. A value indicative of the focus quality of the particle beam at the sample can be determined from such fluctuations. For example, the fluctuations will be more pronounced if the particle beam is better focused at the sample.

According to some embodiments, each of the plural lens current change rates is a constant lens current change rate. The constant lens current change rate may constantly increase the lens current, or it may constantly decrease the lens current.

Since plural lens current change rates are used, plural lens currents at focus are determined. It is to be noted that the focusing magnetic field affecting the particle beam traversing the magnetic lens is not exactly proportional to the lens current supplied to the magnetic lens if the lens current is dynamically changing. If the lens current is increased, the corresponding increase of the magnetic field is delayed relative to the increase of the lens current because induced currents flowing in the pole pieces generate opposite magnetic fields. This delay depends on the lens current change rate and is generally greater for greater lens current change rates. Moreover, the geometry of the magnetic lens is sufficiently complicated to make it difficult to calculate the time varying induced currents at all locations of the pole pieces with sufficient accuracy in order to accurately predict these delays. Therefore, it is not possible to determine a satisfactory optimized lens current based on a lens current at focus from just one measurement obtained at a single lens current change rate.

However, the inventors have found that a satisfactory optimized lens current can be determined based on plural measurements of the lens current at focus performed at plural different lens current change rates.

According to some embodiments, a mathematical model is fitted to the determined lens currents at focus. According to some embodiments herein, the model represents the lens current at focus in dependence of the lens current change rate. For example, the mathematical model can be represented by parameters of a polynomial expression depending on the lens current change rate.

According to some embodiments, the calculating of the optimized lens current includes extrapolating the lens current at focus according to the model to a lens current change rate of zero. The lens current change rate of zero corresponds to a stationary lens current which is used during an inspection of the sample.

According to some embodiments, the lens current at focus according to the model and extrapolated to the lens current change rate of zero is used as the optimized lens current.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
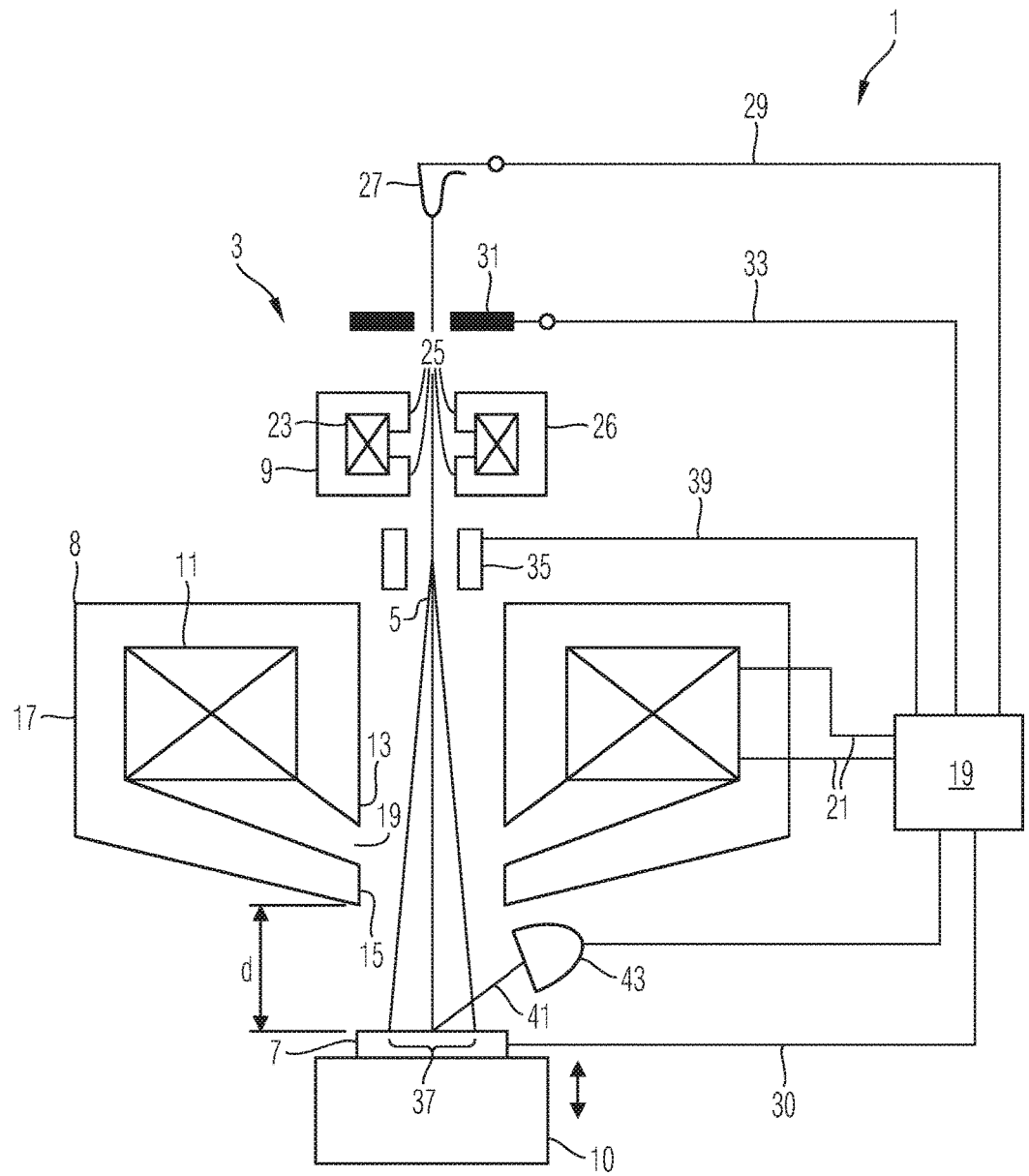
FIG. 1 is a schematic illustration of a particle microscope.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 schematically illustrates a particle microscope 1 having a particle beam system 3 configured to direct a particle beam 5 onto a sample 7, wherein the particle beam system 3 includes magnetic lenses 8 and 9. The magnetic lens 8 is an objective lens of the particle beam system 3, and the magnetic lens 9 is a condenser lens of the particle beam system 3. Both magnetic lenses are traversed by the particle beam 5. The objective lens 8 includes a coil 11 and an upper pole piece 13 and a lower pole piece 15 connected by a yoke 17 surrounding the coil 11. A gap 19 is formed between the upper and lower pole pieces 13, 15. The magnetic lens 8 is energized by an adjustable lens current supplied to the coil from a controller 19 via supply lines 21. The current supplied to the coil 11 generates a magnetic field having field lines extending mainly through the upper pole piece 13, the yoke 17, the lower pole piece 15, and the gap 19. The magnetic field generated in the gap 19 extends to regions traversed by the particle beam 5 and has a focusing effect on the beam 5.

Similarly, also the condenser lens 9 has a coil 23 and pole pieces 25 and a yoke 26 surrounding the coil 23 and providing a gap between the pole pieces. Also the condenser lens 9 is energized by a lens current generated by the controller 19.

The particle beam 5 is emitted from a beam source 27, which is an electron beam source in the illustrated example. The beam source is maintained at a high negative voltage relative to the sample 7. For this purpose, the beam source 27 is connected to the controller 19 via a supply line 29, and the sample 7 is connected to the controller 19 via a supply line 30. The voltage difference between the beam source 27 and the sample 7 determines the kinetic energy the particles of the particle beam 5 have when they are incident on the sample 7.

The particle beam system 3 further includes an anode 31 maintained at an electric potential which is closer to the sample 7 than to the beam source 27. For this purpose, the anode 31 is connected to the controller 19 via a supply line 33. The particles emitted from the particle source 27 are accelerated by an electric field between the particle source 27 and the anode 31, traverse an aperture in the anode 31 and are collimated by the condenser lens 9. The collimated beam 5 traverses a beam deflector 35 which is configured to deflect the particle beam 5 so that the location of incidence of the beam 5 on the surface of the sample 7 can be scanned across the sample surface over a certain range 37. The beam deflector 35 is controlled by the controller 19 via signal lines 39 in order to generate deflecting electric fields and/or deflecting magnetic fields.

The particles of the particle beam 5 incident on the surface of the sample 7 interact with the sample 7 and generate signals indicative of this interaction. These signals may include backscattered electrons and secondary electrons. An exemplary trajectory of such signals is indicated by reference numeral 41 in FIG. 1. The signal is incident on a detector 43 configured to detect the incident signal and to supply corresponding detection signals to the controller 19, wherein the detection signals are indicative of an intensity of the signals 41 generated by the interaction of the particle beam 5 with the sample 7.

The particle microscope 1 can be used to record microscopic images of the sample 7. These images will have a high spatial resolution if the particle beam 5 is finely focused on the sample surface. For example, structures having diameters of about 1 nm can be resolved using advanced particle microscopes available today.

Figure 2:
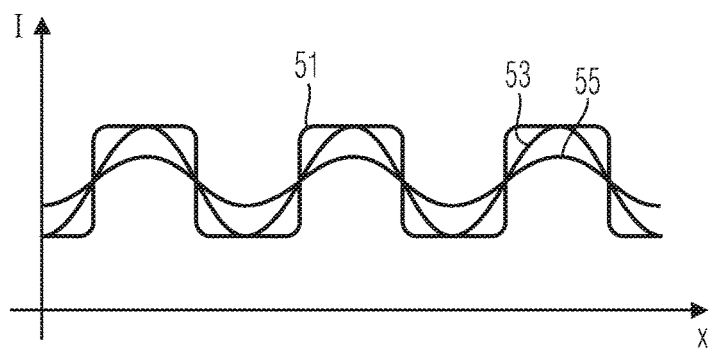
FIG. 2 is a graph illustrating signals obtained at different focus settings.

FIG. 2 is a graph illustrating intensities I of signals 41 detected by detector 43 in dependence of a deflection amount of the particle beam 5 on the sample surface in an x-direction. It is assumed that the sample 7 has a structure generating high and low signal intensities when the beam is scanned across the structure by the particle beam 5.

FIG. 2 shows a line 51 illustrating the detected intensities when the particle beam 5 is finely focused at the sample 7 when it is scanned across the structure. Line 53 in FIG. 2 illustrates the detected intensities when the particle beam 5 has a deteriorated focus when it is scanned across the structure, and line 55 in FIG. 2 illustrates the detected signal intensities when the particle beam 5 has an even worse focus.

It is apparent from FIG. 2 that the focus quality can be determined from the detected signal intensities when the particle beam 5 is scanned across a sample having a structure. For example, peak-to-valley ratios can be used to determine a value indicative of the focus quality. According to another example, a Fourier transform is applied to the detected signal and the spectral intensities in the transformed signal can be used to determine a value indicative of the focus quality. For example, when higher frequencies are present in the transformed function, this can be indicative of a smaller focus.

When the sample 7 is placed on the sample holder 10 in front of the objective lens 8, the distance d of the sample surface from some reference point on the objective lens 8 is not precisely known. Therefore, the lens current supplied to the objective lens 8 has to be adjusted such that the cross section of the beam spot formed on the sample surface has a minimal value or, in other words, such that the particle beam system is "at focus". For this purpose, an estimated lens current is determined at which the particle beam system is close to focus. Further, an upper lens current $I_{up}$ is determined at which the particle beam system is expected to be over-focused, and a lower lens current $I_{lo}$ is determined at which the particle beam system is expected to be under-focused. Thereafter, the lens current is changed at a given first lens current change rate from the lower lens current $I_{lo}$ to the upper lens current $I_{up}$. During this process of increasing the lens current, the particle beam 5 is continuously scanned across the sample, and the achieved contrast C is continuously determined. A line 57 in FIG. 3 indicates the determined contrast C in dependence of the lens current I supplied to the lens while the lens current is increased at a constant lens current change rate from $I_{lo}$ to $I_{up}$. It is apparent from FIG. 3 that the line 57 representing the contrast C in dependence of the lens current I has a peak at $I_{f1}$ which is the lens current supplied to the objective lens 8 when the best focus is achieved during the scan of the lens current from $I_{lo}$ to $I_{up}$. The lens current at focus is $I_{f1}$ at the given lens current change rate, accordingly.

Figure 3:
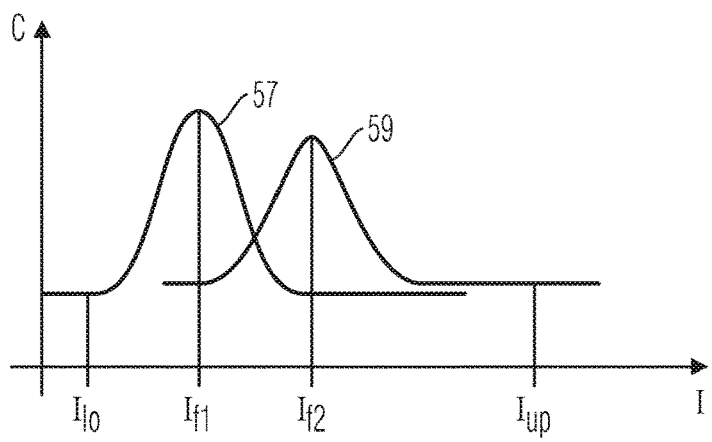
FIG. 3 is a graph illustrating a method of determining a lens current at focus.

A line 59 in FIG. 3 illustrates the determined contrast C when the particle beam 5 is continuously scanned across the same sample during a scan of the lens current from $I_{lo}$ to $I_{up}$ at a given second lens current change rate which is greater than the first lens current change rate. Also the line 59 shows a peak at $I_{f2}$ which is the lens current at focus at the second lens current change rate.

When the lens current is changed from $I_{lo}$ to $I_{up}$, the lens current change rate is positive. From FIG. 3 it is apparent that the greater value of the lens current at focus is obtained at the higher lens current change rate. This can be explained by the greater relative delays due to induced currents in the pole pieces 13 and 15 when the lens current is changed at the higher rate.

Figure 4:
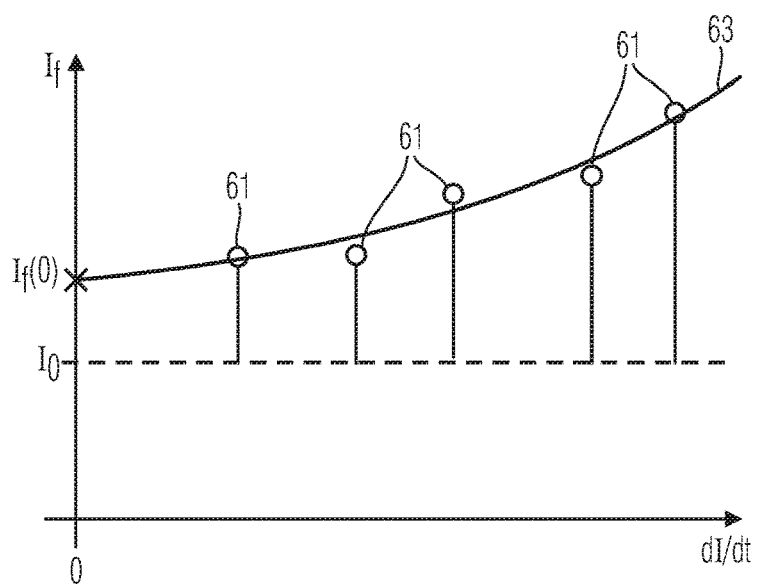
FIG. 4 is a graph illustrating a model representing a lens current at focus in dependence of a lens current change rate.

FIG. 4 is a graph illustrating measurements 61 of the lens current at focus $I_f$ at plural different lens current change rates dI/dt. These measurements 61 are obtained while the distance d of the sample 7 from the objective lens 8 is maintained at a given value and while the kinetic energy of the particles of the particle beam 5 incident on the sample 7 is maintained at a given value. It is apparent from FIG. 4 that the values of the lens current at focus $I_f$ increase with increasing lens current change rates dI/dt. FIG. 4 further shows a representation 63 of a mathematical model fitted to the measurements 61 of the lens current at focus $I_f$. In this example, the mathematical model 63 is a function of one variable. The variable is the lens current change rate dI/dt, and the function value is the lens current at focus $I_f$. Further, the function has parameters which are adapted such that the function approximates the measurements 61. The function can be a polynomial expression of dI/dt, for example.

The mathematical model can be extrapolated to a lens current change rate dI/dt of zero. The value of the lens current at focus extrapolated to the lens current change rate dI/dt=0 will be referred to as $I_f(0)$ in the following.

The inventor has found that the value of the lens current according to the model and extrapolated to dI/dt=0 can be used as an estimation for the true lens current $I_0$ obtained according to conventional focusing methods for achieving a best image resolutions in recorded images. For example, $I_0$ can be determined by alternatingly increasing and decreasing the lens current over continuously decreasing scan ranges until an optimal focus is reached. The value of the true lens current at focus $I_0$ for the given value of the distance and the given value of the kinetic energy of the particles of the particle beam is also indicated in FIG. 4, and this value differs from the value $I_f(0)$. The difference can be represented by $\Delta I_f(0) = I_f(0) - I_0$.

It appears that the value of the lens current according to the model and extrapolated to dI/dt=0 can be used as an estimation for the true lens current $I_0$ if the difference $\Delta I_f(0)$ can be predicted. Now, the inventor has further found that the difference $\Delta I_f(0)$ depends on the value of the true lens current $I_0$ itself.

Figure 5:
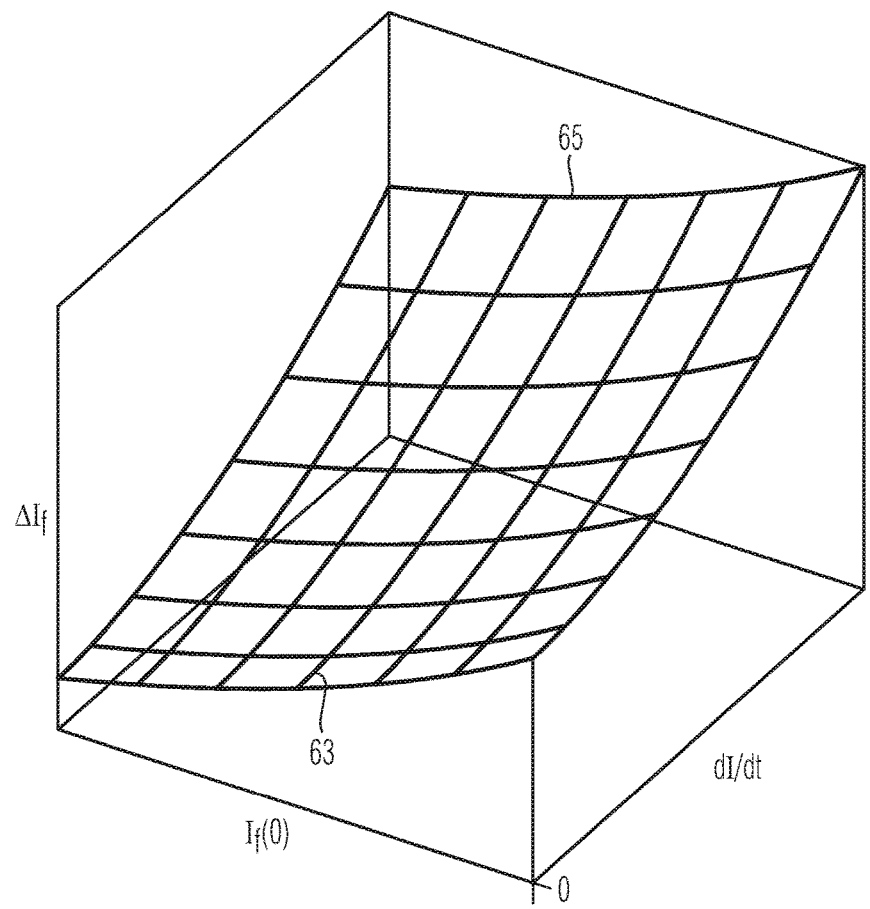
FIG. 5 is a graph illustrating a model representing the lens current at focus in dependence of the lens current change rate and a further setting.

FIG. 5 is a graph illustrating an extended mathematical model 65 representing $\Delta I_f$ in dependence of the lens current change rate dI/dt and in dependence of $I_f(0)$ which is linked to the true lens current $I_0$ by $I_f(0) = \Delta I_f(0) + I_0$. The line 63 shown in FIG. 4 and representing the model for particular values of the distance d and the kinetic energy of the particles of the particle beam is part of the extended model 65 shown in FIG. 5. Other values of the distance d and the kinetic energy involve other true lens currents $I_0$ for achieving a focused image.

The mathematical model can be, for example, represented by a polynomial expression depending on the lens current change rate dI/dt and the lens current $I_f(0)$, wherein the polynomial expression has parameters which are adapted such that the model approximates measurements (not shown in FIG. 5). The measurements include measurements of the lens current at focus $I_f$ at plural different pairs of the lens current change rate dI/dt and the lens current $I_f(0)$. Different values of the lens current change rate dI/dt can be set as illustrated above with reference to FIG. 4. Different values of $I_f(0)$ can be set by changing the distance d of the sample 7 from the objective lens 8 or by changing the kinetic energy of the particles of the particle beam 5 incident on the sample 7.

The mathematical model obtained based on measurements performed using a particular lens and microscope represents focusing properties of this lens and microscope, respectively.

The model can be used in a method of focusing a particle microscope as follows: Assume that a sample to be inspected is positioned at a given distance from the objective lens of the particle microscope, and the kinetic energy of the particles incident on the sample is set to a given value. At that time, the precise value of the distance of the sample from the objective lens is not known.

Therefore, the true lens current $I_0$ required for achieving, for example, a highest resolution is also not exactly known. Conventionally, this true lens current $I_0$ is determined in an iterative procedure starting from a lens current value which can be far off from the true lens current $I_0$ to be determined. According to the present disclosure, the lens current at focus $I_f(dI/dt)$ is measured for two or more values of $dI/dt$. Thereafter, the model 65 is used to approximate the measured values. Specifically, the approximation includes determining the value of $I_f(0)$ such that the measured values are approximated by the model. The value of $\Delta I_f(0)$ is determined based on the model using the determined value of $I_f(0)$ and $dI/dt=0$ as parameters. Using the relation $I_0=I_f(0)-\Delta I_f(0)$, an estimated value of $I_0$ can be determined based of the determined values of $I_f(0)$ and $\Delta I_f(0)$.

The actual lens current can then be set to estimated lens current $I_0$. This lens current can be directly used for inspection of the sample, or it can be further improved towards the true lens current using one or the other conventional method. Moreover, since the magnetic objective lens exhibits a hysteresis, it can be preferable to set the lens current to the estimated lens current always following a predetermined procedure. Such procedure may include increasing the lens current to a maximum value such that the pole pieces and other structures of the objective lens are close to or beyond magnetic saturation. Thereafter, the lens current is gradually reduced according to a predetermined speed $dI/dt$ until the estimated lens current $I_0$ is reached. Thereafter, the lens current is maintained at this value until it is desired to change the current for purposes other than setting the lens current to the estimated lens current $I_0$.

The mathematical model 65 determined from measurements represents a specific property of the objective lens. This mathematical model can be determined once, when the objective lens is manufactured, for example, or in regular or irregular intervals thereafter. The mathematical model of the objective lens can then be used for rapidly focusing the particle microscope whenever this is desirable.

Figure 6:
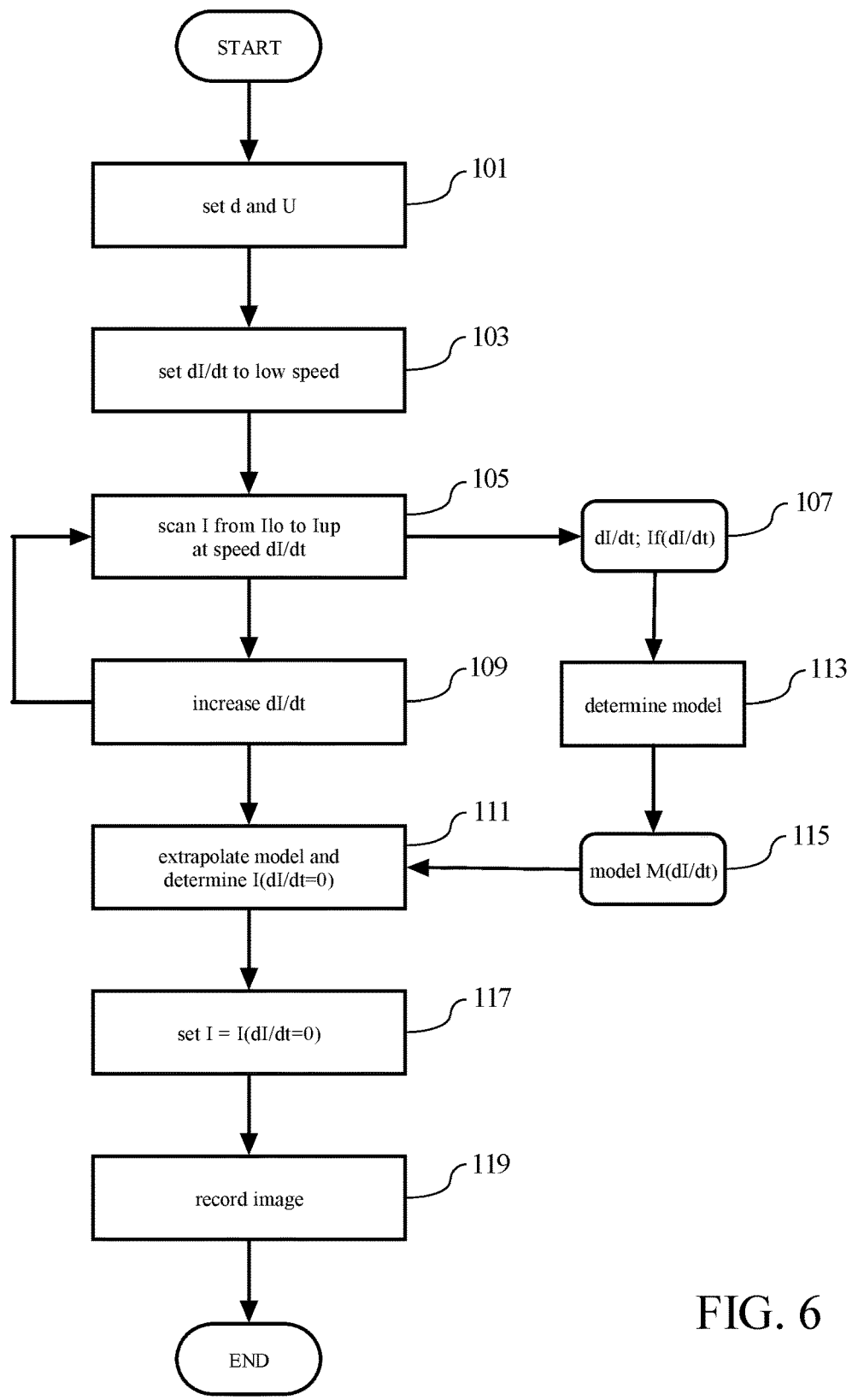
FIG. 6 is a flowchart illustrating a method of operating a particle microscope.

An embodiment of a method of operating a particle microscope in which the lens current at focus is determined at different lens current change rates will be illustrated in more detail with reference to FIG. 6 below.

The method starts, and a distance d of a sample from an objective lens and a high voltage between a particle source and the sample are set in a step 101. The high voltage U is set according to the user who intends to use particles of a certain kinetic energy at which certain features of the sample become visible in images recorded with the particle microscope. The distance d is set by arranging the sample some distance away from the objective lens using the sample holder. It is to be noted that, at the time of performing step 101, the distance d is not precisely known and the user is satisfied if the sample is arranged within a distance range relative to the objective lens such that it is possible to record images of the sample using the particle microscope.

A lens current change rate $dI/dt$ is set to a low speed in a step 103. Thereafter, the lens current I is scanned from a low current $I_{lo}$ to a high current $I_{up}$ at the current speed $dI/dt$ in a step 105. During step 105, the particle beam is continuously scanned across the sample surface and the intensity of signals generated by the particle beam is recorded as illustrated with reference to FIG. 2 above. Moreover, a contrast C is determined based on the detected intensities. A peak of the contrast C occurring during the scan of the lens current from $I_{lo}$ to $I_{up}$ is determined and identified as a lens current at focus $I_f$ at the present speed $dI/dt$. The values $dI/dt$ and $I_f(dI/dt)$ are stored in a memory 107. Thereafter, the lens current change rate $dI/dt$ is increased in a step 109. If the increased lens current change rate is greater than or equal to a predetermined high speed, the method proceeds to a step 111, and to step 105 otherwise. If the method proceeds with step 105, the lens current is again scanned from $I_{lo}$ to $I_{up}$ at the present lens current change rate $dI/dt$, and the determined values of $dI/dt$ and $I_f(dI/dt)$ are stored in the memory 107.

A mathematical model M of the data stored in the memory 107 is determined in a step 113, and the mathematical model determined in step 113 is stored as the model $M(dI/dt)$ in a memory 115. Herein, step 113 can be performed parallel with the steps 105 and 109 such that the model is continuously developed an updated during the measurement performed at the step 105, or the model can determined in step 113 after the steps 105 and 109 have been completed. The model $M(dI/dt)$ is determined such that it is available for processing in step 111. In step 111, the model is extrapolated to a lens current change rate of zero. The extrapolated lens current $I(dI/dt)=0$ is determined, accordingly. This lens current $I(dI/dt)=0$ represents an optimized lens current, and the lens current supplied to the objective lens is set to this optimized lens current in a step 117. The optimized lens current is used thereafter for inspecting the sample. In particular, this optimized lens current is used in a step 119 in which an image of the sample is recorded with the particle microscope.

Even though the lens current determined in step 117 is referred to as an optimized lens current, this does not mean that this optimized lens current could not be further improved. For example, the user may choose to further adjust the lens current based on an evaluation of the images recorded in step 119. Thereafter, further images can be recorded.

A further embodiment of a method of operating a particle microscope in which an optimized lens current is determined based on the lens current at focus determined at different lens current change rates will be illustrated with reference to FIGS. 7 and 8 below.

The method illustrated with reference to FIG. 6 above uses a mathematical model which depends from the lens current change rate $dI/dt$ as its only variable. Moreover, the distance of the sample from the objective lens set in step 101 of the method shown in FIG. 6 is maintained constant and is also used when the images are recorded in step 119.

Figure 7:
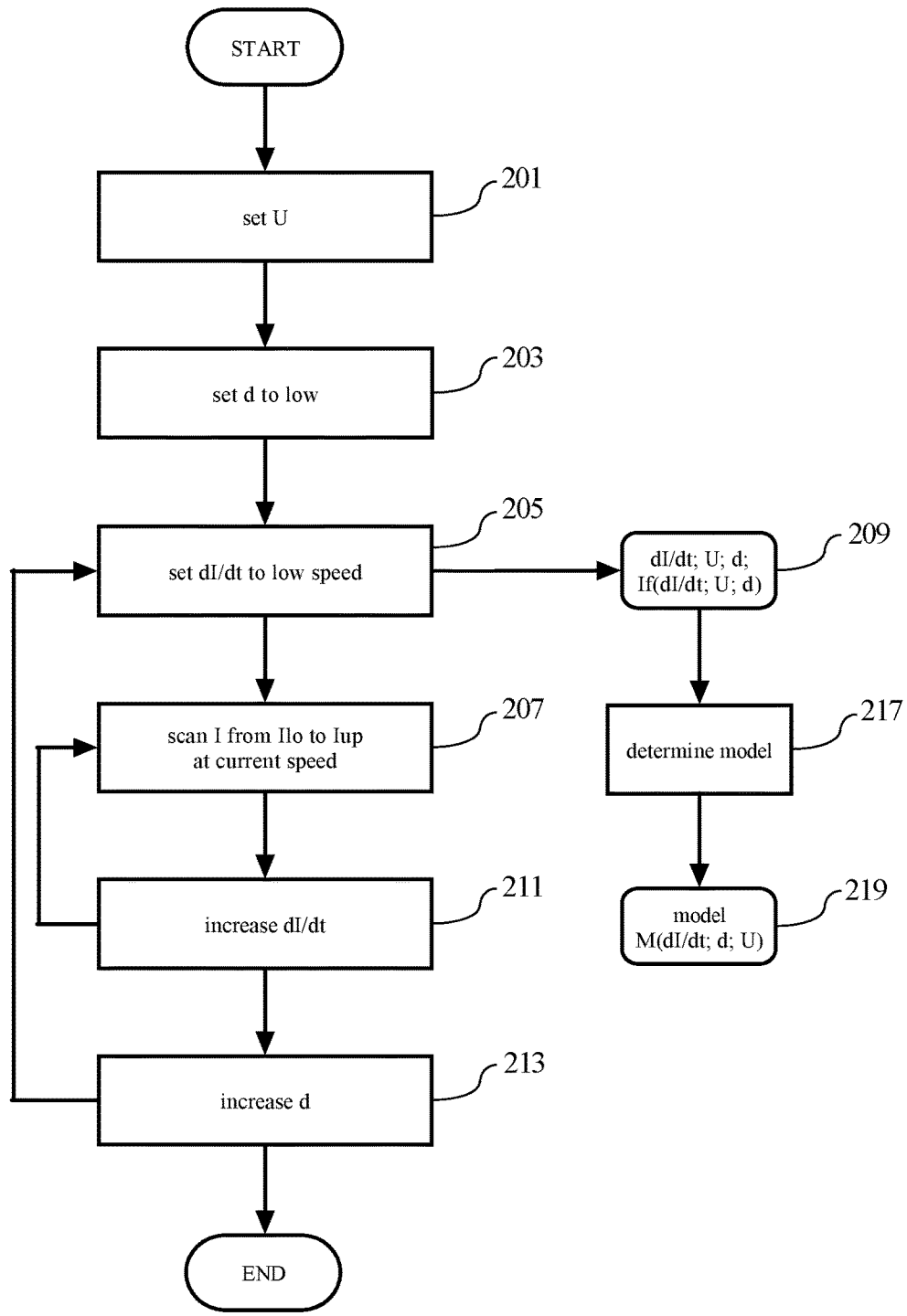
FIG. 7 is a flowchart illustrating a further method of operating a particle microscope.
Figure 8:
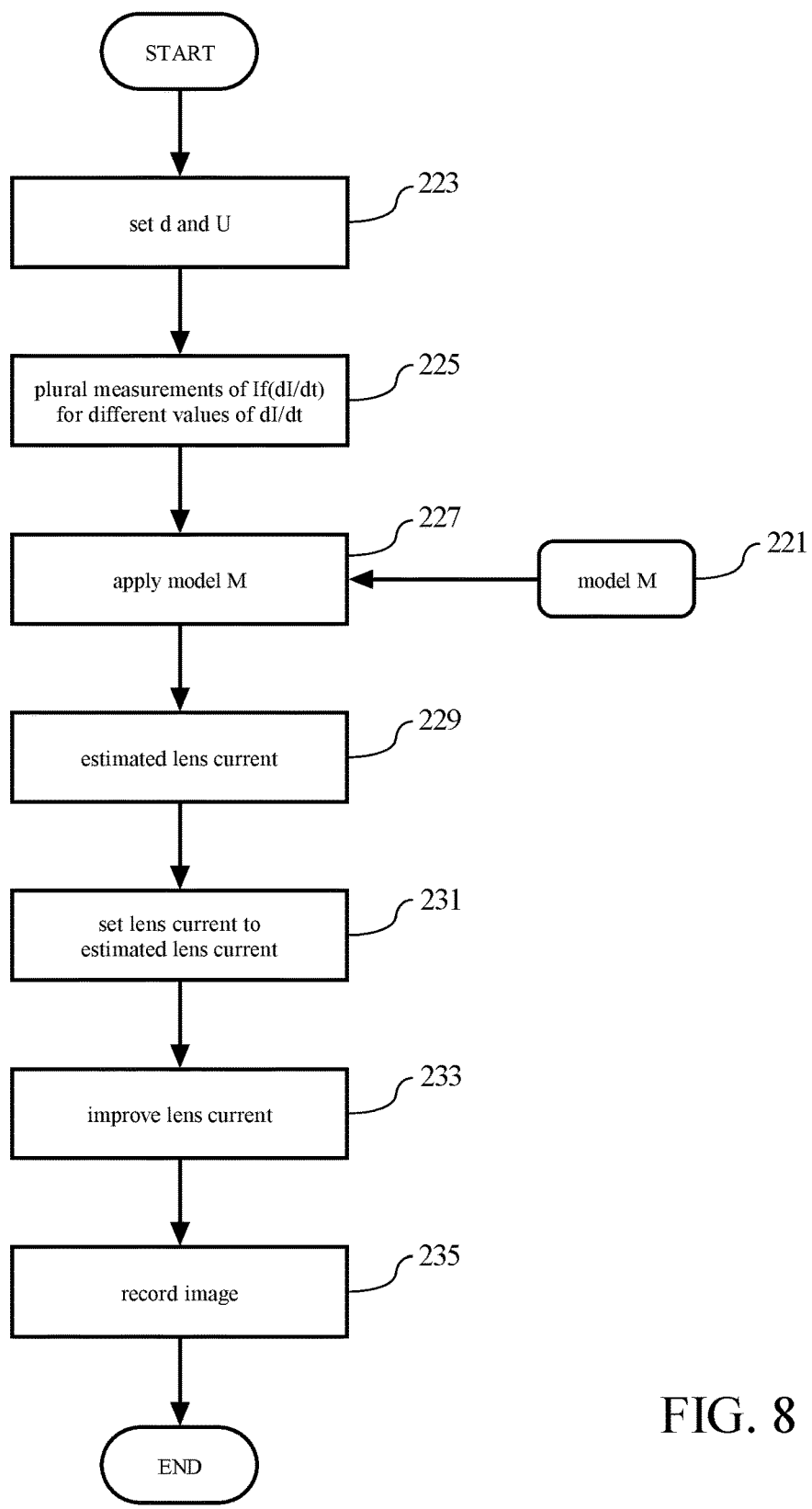
FIG. 8 is a flowchart illustrating a still further method of operating a particle microscope.

The method shown in FIGS. 7 and 8 uses a mathematical model which has the lens current change rate $dI/dt$ as a variable. In addition, the mathematical model has the lens current at focus extrapolated to the lens current change rate $dI/dt=0$ as an additional variable. This allows to determine the mathematical model M based on measurements performed at different lens current change rates $dI/dt$ and different distances d or different voltages U. The model will then represent specific properties of the objective lens, wherein these properties relate to the focusing capabilities of the objective lens at different distances d of the sample from the objective lens and different voltages U.

The determining of such model is shown in FIG. 7. In FIG. 8, the model determined in FIG. 7 is used for rapidly finding an optimized lens current for inspecting a sample which is arranged at a new given distance d from the objective lens and wherein the voltage U is set to a new given voltage U.

Specifically, upon start of the method shown in FIG. 7, the voltage U between the particle source and the sample is set to a suitable value in a step 201, and the distance d is set to a low value in a step 203. The lens current change rate dI/dt is set to a low speed in a step 205, similar to step 105 of FIG. 6. The lens current is then scanned from a low current $I_{lo}$ to a high current $I_{up}$ in a step 207. During such scan, the lens current at focus is determined as illustrated with reference to step 105 of the method shown in FIG. 6 above. The present lens current change rate dI/dt and lens current at focus $I_f(dI/dt)$ are stored in a memory 209.

When the scan of the lens current I has completed in step 206, the lens current change rate dI/dt is increased in a step 211. Depending on whether the high speed of the lens current has been reached in step 211, the method proceeds with step 207 in which a further scan of the lens current is performed, or with step 213 in which the distance d is increased. Depending on whether a maximum distance has been reached in step 213, the method proceeds with step 205 in which the lens current change speed dI/dt is reset to the low speed, or the performing of the measurements is completed.

Before finally terminating, however, a mathematical model of the data accumulated in memory 209 is determined in a step 217 and stored as the model M(dI/dt; $I_f(0)$) in a memory 219. The model is specific to the type of microscope which was used to determine the model. In some instances, the model can be used for other microscopes of the dame type. In other instances, the model is used only together with exactly the same instance of microscope which was used to determine the model.

This model can remain in the same memory 219, or it can be transferred to a different memory 221 shown in FIG. 8 which can be accessed by the particle microscope in the future to perform the method illustrated in FIG. 8. In this method, a sample is arranged in front of the objective lens at a distance d, selected by the user, and the voltage between the particle source and the sample is also selected by the user in a step 223.

The lens current at focus $I_f(dI/dt)$ is determined for two or more values of dI/dt in a step 225. The model M is applied to the measured lens currents at focus in a step 227. An estimated lens current is determined in a step 229. The lens current is set to the estimated lens current in a step 231. This estimated lens current can be directly used for recording one or more images in a step 235. Alternatively, the lens current set in step 231 can be further improved by any useful procedure in a step 223 before the one or more images are recorded in step 235.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of operating a particle microscope comprising a particle beam system configured to direct a particle beam onto a sample to be inspected, the particle beam system comprising a magnetic lens energized by an adjustable lens current for focusing the particle beam on the sample, the sample being positioned at an adjustable distance from the magnetic lens, particles of the particle beam having an adjustable kinetic energy when impinging on the sample, the method comprising:
    positioning the sample relative to the magnetic lens;
    adjusting the kinetic energy;
    changing the lens current at plural different lens current change rates;
    determining a lens current at focus for each of the plural different lens current change rates;
    determining an optimized lens current based on the determined lens currents at focus and the lens current change rates; and
    setting the lens current to the optimized lens current and inspecting the sample using the set lens current.

2. The method of claim 1, wherein each of the plural different lens current change rates is a constant lens current change rate.

3. The method of claim 2, wherein the constant lens current change rate is selected from the group consisting of a rate constantly increasing the lens current and a rate constantly decreasing the lens current.

4. The method of claim 1, further comprising fitting a mathematical model to the determined lens currents at focus.

5. The method of claim 4, wherein the model represents the lens current at focus in dependence of the lens current change rate.

6. The method of claim 4, wherein determining the optimized lens current comprises extrapolating the lens current at focus according to the model to a lens current change rate of zero.

7. The method of claim 6, further comprising using the lens current at focus according to the model and extrapolated to the lens current change rate of zero as the optimized lens current.

8. The method of claim 1, wherein the lens current at focus is the lens current at which the particle beam is focused on the sample while the lens current is changed at the respective lens current change rate.

9. The method of claim 1, wherein inspecting the sample comprises recording an image of the sample.

10. The method of claim 1, wherein the inspecting of the sample comprises recording an image of the sample.

11. A method of operating a particle microscope, the particle microscope comprising a particle beam system configured to direct a particle beam onto a sample to be inspected, the particle beam system comprising a magnetic lens energized by an adjustable lens current for focusing the particle beam on the sample, the sample being positioned at an adjustable distance from the magnetic lens, particles of the particle beam having an adjustable kinetic energy when impinging on the sample, the method comprising:
    positioning a sample at at least one given distance from the magnetic lens and adjusting the kinetic energy to at least one given kinetic energy so that at least two different pairs of given distances and given kinetic energies are subsequently used as different settings;
    at each of the at least two different settings, changing the lens current at plural different lens current change rates, and determining a lens current at focus for each of the plural different lens current change rates;

storing values representing the determined lens currents at focus at the corresponding lens current change rates at the different settings;

positioning a sample at a given distance from the magnetic lens;

adjusting the kinetic energy to a given kinetic energy;

changing the lens current at a given lens current change rate and determining a lens current at focus;

determining an optimized lens current based on the determined lens current at focus, the given lens current change rate and the stored values; and setting the lens current to the optimized lens current and inspecting the sample using the set lens current.

12. The method of claim 11, wherein each of the plural different lens current change rates is a constant lens current change rate.

13. The method of claim 12, wherein the constant lens current change rate is selected from the group consisting of a rate constantly increasing the lens current and a rate constantly decreasing the lens current.

14. The method of claim 11, further comprising fitting a mathematical model to the determined lens currents at focus.

15. The method of claim 14, wherein the model represents the lens current at focus in dependence of the lens current change rate and the at least two settings.

16. The method of claim 14, wherein determining the optimized lens current comprises extrapolating the lens current at focus according to the model to a lens current change rate of zero.

17. The method of claim 16, wherein the lens current at focus according to the model and extrapolated to the lens current change rate of zero is used as the optimized lens current.

18. The method of claim 11, wherein the lens current at focus is the lens current at which the particle beam is focused on the sample while the lens current is changed at the respective lens current change rate.

19. A method of operating a particle microscope, wherein the particle microscope comprises a particle beam system configured to direct a particle beam onto a sample to be inspected, wherein the particle beam system comprises a magnetic lens energized by an adjustable lens current for focusing the particle beam on the sample, wherein the sample is positioned at an adjustable distance from the magnetic lens and wherein particles of the particle beam have an adjustable kinetic energy when impinging on the sample;

wherein the method comprises:

inputting data representing plural lens currents at focus at different lens current change rates and different settings, wherein a setting corresponds to a pair of a distance of a sample from the magnetic lens and a kinetic energy;

positioning a sample at a given distance from the magnetic lens;

changing the lens current at a given lens current change rate and determining a lens current at focus;

determining an optimized lens current based on the determined lens current at focus, the given lens current change rate and the inputted data; and setting the lens current to the optimized lens current and inspecting the sample using the set lens current.

20. The method of claim 19, wherein the lens current change rate is a constant lens current change rate.

21. The method of claim 20, wherein the constant lens current change rate is one of a rate constantly increasing the lens current and a rate constantly decreasing the lens current.

22. The method of claim 19, further comprising fitting a mathematical model to the plural lens currents at focus.

23. The method of claim 22, wherein the model represents the lens current at focus in dependence of the lens current change rate and the settings.

24. The method of claim 22, wherein determining the optimized lens current comprises extrapolating the lens current at focus according to the model to a lens current change rate of zero.

25. The method of claim 24, further comprising using the lens current at focus according to the model and extrapolated to the lens current change rate of zero as the optimized lens current.

26. The method of claim 19, wherein the data comprise parameters of a model representing the lens current at focus in dependence of the lens current change rate and the settings.

27. The method of claim 26, wherein determining the optimized lens current comprises extrapolating the lens current at focus according to the model to a lens current change rate of zero.

28. The method of claim 27, further comprising using the lens current at focus according to the model and extrapolated to the lens current change rate of zero as the optimized lens current.

29. The method of claim 19, wherein the data are inputted from a storage medium.

30. The method of claim 19, wherein the lens current at focus is the lens current at which the particle beam is focused on the sample while the lens current is changed at the respective lens current change rate.

31. The method of claim 19, wherein inspecting the sample comprises recording an image of the sample.

\* \* \* \* \*